(12) United States Patent
Onishi et al.

(10) Patent No.: US 6,426,583 B1
(45) Date of Patent: Jul. 30, 2002

(54) SURFACE ACOUSTIC WAVE ELEMENT, METHOD FOR PRODUCING THE SAME AND SURFACE ACOUSTIC WAVE DEVICE USING THE SAME

(75) Inventors: Keiji Onishi; Hiroki Sato; Yoshihiro Tomita, all of Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/587,938

(22) Filed: Jun. 6, 2000

(30) Foreign Application Priority Data

Jun. 14, 1999 (JP) ............................... 11-166684

(51) Int. Cl.[7] ................................. H03H 9/25
(52) U.S. Cl. ................... 310/313 R; 29/25.35
(58) Field of Search ................. 310/313 A, 313 R; 29/29.35

(56) References Cited

U.S. PATENT DOCUMENTS

| | | | | | |
|---|---|---|---|---|---|
| 3,943,389 | A | * | 3/1976 | Hickernell et al. | 310/313 R |
| 4,342,012 | A | * | 7/1982 | Inaba et al. | 333/155 |
| 4,603,275 | A | * | 7/1986 | Mochizuki et al. | 310/313 B |
| 4,752,709 | A | * | 6/1988 | Fujishima et al. | 310/313 A |
| 5,446,330 | A | * | 8/1995 | Eda et al. | 310/313 R |
| 5,712,523 | A | * | 1/1998 | Nakashima et al. | 310/313 R |
| 5,920,142 | A | * | 7/1999 | Onishi et al. | 310/313 R |
| 5,991,989 | A | * | 11/1999 | Onishi et al. | 310/313 R |
| 5,998,907 | A | * | 12/1999 | Taguchi et al. | 310/313 R |
| 6,049,155 | A | * | 4/2000 | Graebner et al. | 310/313 R |
| 6,121,859 | A | * | 9/2000 | Takahashi et al. | 310/313 R |
| 6,236,141 | B1 | * | 5/2001 | Sato et al. | 310/313 R |
| 6,310,425 | B1 | * | 10/2001 | Tanaka | 310/313 R |

FOREIGN PATENT DOCUMENTS

| | | | | | |
|---|---|---|---|---|---|
| JP | 4-82315 | A | * | 3/1992 | 310/313 R |
| JP | 405022063 | A | * | 1/1993 | 310/313 R |
| JP | 6-326541 | A | | 11/1994 | H03H/3/08 |
| JP | 9-294045 | A | * | 11/1997 | 310/313 R |
| JP | 11-55070 | A | * | 2/1999 | 310/313 R |
| JP | 2001-60846 | A | * | 3/2001 | 310/313 A |

OTHER PUBLICATIONS

Onishi et al., A Novel Temperature Compensation Method for SAW Devices Using Direct Bonding Techniques:, 1997 IEEE Ultrasonics Symposium Dec. 1997.

* cited by examiner

*Primary Examiner*—Thomas M. Dougherty
(74) *Attorney, Agent, or Firm*—Merchant & Gould PC

(57) ABSTRACT

A surface acoustic wave element includes a laminated substrate where a first substrate made of a piezoelectric material is laminated over a second substrate made of a material different from that of the first substrate, and at least one pair of comb-shaped electrodes formed on one main plane of the first substrate. A step or a notch is formed on the periphery of the laminated substrate on the side of the first substrate.

14 Claims, 13 Drawing Sheets

SURFACE ACOUSTIC WAVE ELEMENT, METHOD FOR PRODUCING THE SAME AND SURFACE ACOUSTIC WAVE DEVICE USING THE SAME

BACKGROUND OF THE INVENTION

1. Field of the Invention

The present invention relates to a surface acoustic wave element including a laminated substrate, a method for producing the same and a surface acoustic wave device using the same.

2. Description of the Related Art

In the development of mobile communication equipment, it is desired to achieve high performance of a surface acoustic wave element, which is one of the key devices constituting the equipment. In the case where a band in which signals are sent out is close to a band in which signals are received, as seen in the recent mobile communication systems, it is difficult to achieve a sharp cut-off property in the temperature range used. This is due to the characteristics of a piezoelectric substrate used in conventional surface acoustic wave elements. Specifically, this is because although conventional piezoelectric substrates have a coupling coefficient sufficient to achieve a required band width of the system, in general they have a large frequency temperature coefficient. In order to cope with this problem, it was reported that attaching an existing piezoelectric substrate to an auxiliary substrate having a thermal expansion coefficient different from that of the piezoelectric substrate provides a surface acoustic wave element having a large coupling coefficient and excellent temperature stability (Proc. 1997 IEEE Ultrasonics Symposium, pp. 227–230).

Hereinafter, a conventional surface acoustic wave element will be described. FIG. 13A is a perspective view of an example of a conventional surface acoustic wave element, and FIG. 13B is a cross-sectional view thereof taken along line Z—Z in FIG. 13A. Referring to FIGS. 13A and 13B, the conventional surface acoustic wave element includes a first substrate 401, a second substrate 402, a comb-shaped electrode 403 including electrodes 403a and 403b, and a reflector 404. As the first substrate 401, a 36° Y-cut X-propagating lithium tantalate single crystal is used, for example. As the second substrate 402, a glass substrate having a thermal expansion coefficient smaller than that of the first substrate 401 in the propagation direction of a surface acoustic wave is used, for example. The thickness of the first substrate 401 is sufficiently smaller than that of the second substrate 402, and is sufficiently larger than the wavelength of the surface acoustic wave. For example, the first substrate 401 is about 40 μm thick and the second substrate 402 is about 310 μm thick. The first substrate 401 and the second substrate 402 are joined together substantially directly without an adhesive or the like therebetween. Such a structure allows control of the frequency temperature coefficient while maintaining the characteristics of the existing piezoelectric substrate.

However, the conventional surface acoustic wave element as described above has the following problems. Since it has a laminate structure where the piezoelectric single crystal several tens of μm thick and the glass substrate are laminated, it is difficult to handle the surface acoustic wave element. For example, in mounting the surface acoustic wave element on a package, in particular, in picking up the surface acoustic wave element, cracking or fracturing may occur in the piezoelectric single crystal layer. Moreover, in dividing a wafer into individual surface acoustic wave elements, when it is cut with a cutting blade selected based on the glass substrate, fracturing or chipping may occur in the piezoelectric single crystal portion during cutting because of the difference in the characteristics between the materials.

SUMMARY OF THE INVENTION

It is an object of the present invention to provide a surface acoustic wave element that can be handled easily and has few defects and a surface acoustic wave device using the same. It is another object of the present invention to provide a method for producing a surface acoustic wave element that allows a surface acoustic wave element to be produced reliably and inexpensively by preventing the generation of defects in the process of separating into elements.

In order to achieve the above objects, a surface acoustic wave element of the present invention includes a laminated substrate where a first substrate made of a piezoelectric material is laminated over a second substrate made of a material different from that of the first substrate, and includes at least one pair of comb-shaped electrodes formed on one main plane of the first substrate. A step or a notch is formed on the periphery of the laminated substrate on the side of the first substrate. This embodiment provides a surface acoustic wave element that can be handled easily and has few defects.

In the above-surface acoustic wave element, it is preferable that the first substrate is made of a piezoelectric single crystal. This embodiment provides a surface acoustic wave element having a small propagation loss.

In the above-surface acoustic wave element, it is preferable that the second substrate is made of glass. This embodiment provides the laminated substrate with a high joining strength, and thermal stress can be applied effectively onto the surface of the first substrate. Therefore a surface acoustic wave element having excellent temperature stability can be obtained.

In the above-surface acoustic wave element, the first substrate may be laminated directly on the second substrate.

In the above-surface acoustic wave element, the first substrate may be laminated over the second substrate via an adhesive. This embodiment increases the degree of freedom in selection of the type of the substrate and provides a surface acoustic wave element that can be produced particularly easily.

In the above-surface acoustic wave element, the step or the notch may be formed only in the first substrate.

In the above-surface acoustic wave element, the step or the notch may be formed from the first substrate into the second substrate.

Furthermore, a method for producing a surface acoustic wave element of the present invention includes (a) forming a laminated substrate where a first substrate made of a piezoelectric material and provided with a pair of comb-link electrodes on one main plane thereof is laminated over a second substrate made of a material different from that of the first substrate; (b) forming a groove on a portion around the comb-shaped electrodes of the laminated substrate; and (c) grinding at an approximately central portion of the groove on the laminated substrate in a width narrower than that of the groove so as to cut the laminated substrate. This embodiment allows the surface acoustic wave element of the present invention to be produced reliably at a low cost.

In the above method, it is preferable that in the process (b), the groove is formed by grinding the laminated substrate, and the grinding in the process (b) is performed at a speed lower than that of the grinding in the process (c). This embodiment suppresses the generation of defects in the first substrate made of a piezoelectric material, and allows the surface acoustic wave element to be produced in high productivity.

In the above method, the groove may be approximately V-shaped in section. According to this embodiment, the notch can be formed on the periphery on the side of the first substrate.

Furthermore, a surface acoustic wave device of the present invention includes a substrate and a surface acoustic wave element mounted on the substrate, wherein the surface acoustic wave element is the surface acoustic wave element of the present invention.

In the above-surface acoustic wave device, it is preferable that the surface acoustic wave element is mounted on the substrate in a face-down manner. This embodiment provides a surface acoustic wave device without degradation of the characteristics.

As described above, in the surface acoustic wave element of the present invention, the step or the notch is formed on the periphery on the side of the first substrate made of a piezoelectric material. Therefore, the present invention provides a surface acoustic wave element that can be handled easily and has few defects.

Furthermore, the method for producing a surface acoustic wave element of the present invention allows the surface acoustic wave element of the present invention that can be handled easily to be produced reliably and at a low cost.

Furthermore, the surface acoustic wave device of the present invention can be produced easily and has high reliability, because the surface acoustic wave element of the present invention is used.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying drawings.

Embodiment 1

In Embodiment 1, an example of a surface acoustic wave element of the present invention will be described.

Figure 1A:
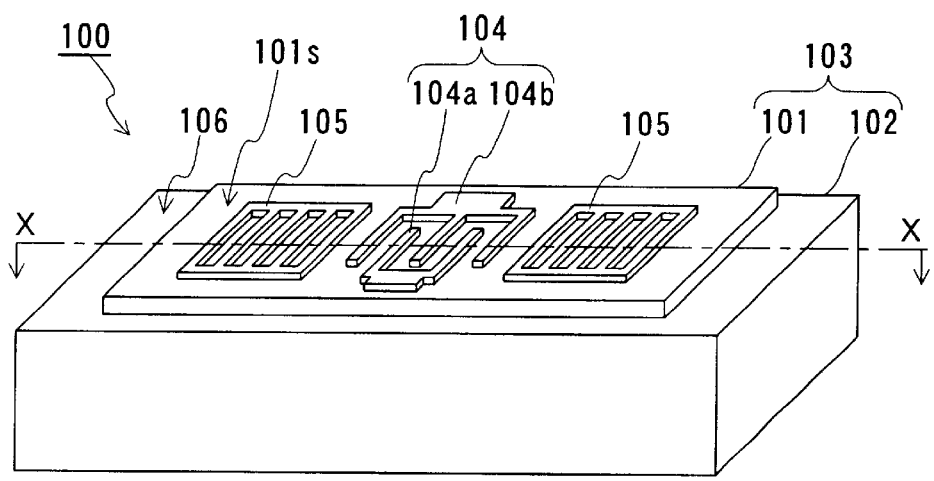
FIG. 1A is a perspective view showing an example of a surface acoustic wave element of the present invention.
Figure 1B:
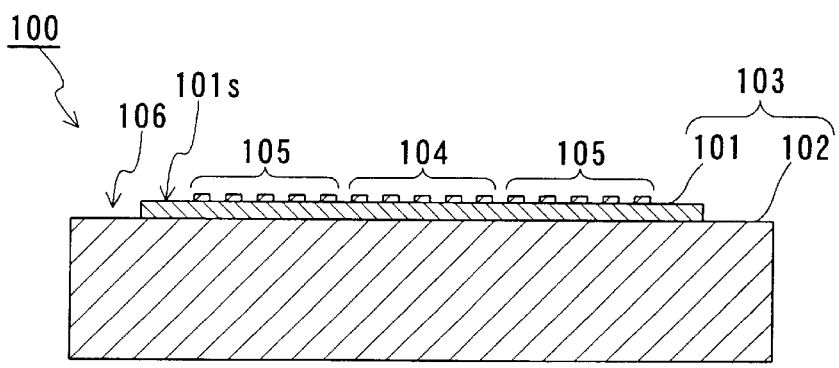
FIG. 1B is a cross-sectional view of the surface acoustic wave element of FIG. 1A.

FIG. 1A is a perspective view of a surface acoustic wave element 100 of Embodiment 1, and FIG. 1B is a cross-sectional view thereof taken along line X—X in FIG. 1A.

Referring to FIGS. 1A and 1B, the surface acoustic wave element 100 includes a laminated substrate 103 comprising a first substrate 101 and a second substrate 102, a comb-shaped electrode 104, and a reflector 105. A step 106 is formed on the periphery (side face) of the laminated substrate 103 on the side of the first substrate 101.

The first substrate 101 is made of a piezoelectric material, and for example, a piezoelectric single crystal can be used. Examples of the piezoelectric single crystal include lithium tantalate, lithium niobate, quartz crystal, and Langasite . More specifically, a 36° Y-cut X-propagating lithium tantalate can be used, for example. The thickness of the first substrate 101 can be varied depending on the element, but for example can be 5 $\mu$m to 100 $\mu$m. The first substrate 101 is laminated directly on the second substrate 102. In other words, the first substrate 101 is joined directly to the second substrate 102 without an adhesive or the like therebetween.

The second substrate 102 is made of a material different from that of the first substrate 101, and has a thermal expansion coefficient different from that of the first substrate 101. For the second substrate 102, glass, silicon, or quartz having a thermal expansion coefficient smaller than that of the first substrate 101 in the propagation direction of the surface acoustic wave can be used, for example. The thickness of the second substrate 102 can be varied depending on the element, but for example can be 200 $\mu$m to 400 $\mu$m.

The comb-shaped electrode 104 includes a pair of opposite combshaped electrodes 104a and 104b. The comb-shaped electrode 104 is formed on a surface 101s of the first substrate 101. The surface 101s is one of the main planes of the first substrate 101. The comb-shaped electrode 104 is made of an aluminum alloy, for example. There may be a plurality of comb-shaped electrodes 104.

The reflector 105 is formed to confine the surface acoustic wave exited in the comb-shaped electrode 104 therein. For the comb-shaped electrode 104 and the reflector 105, any suitable shapes can be used.

The step 106 is formed on the side face of the portion of the laminated substrate 103 where the comb-shaped electrode 104 is formed. In other words, the step 106 is formed on the periphery of the laminated substrate 103 on the side of the first substrate 101. The formation of the step makes the area of the surface of the first substrate 101 (the surface opposite to the face in contact with the second substrate 102) substantially smaller than that of the bottom face of the second substrate 102 (the face opposite to the face in contact with the first substrate 101).

Figure 2:
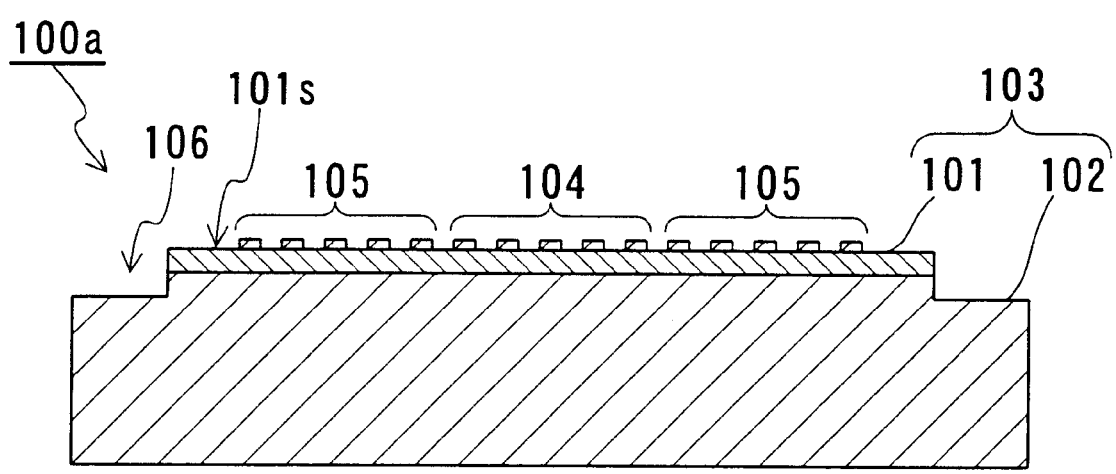
FIG. 2 is a cross-sectional view showing another example of the surface acoustic wave element of the present invention.
Figure 3:
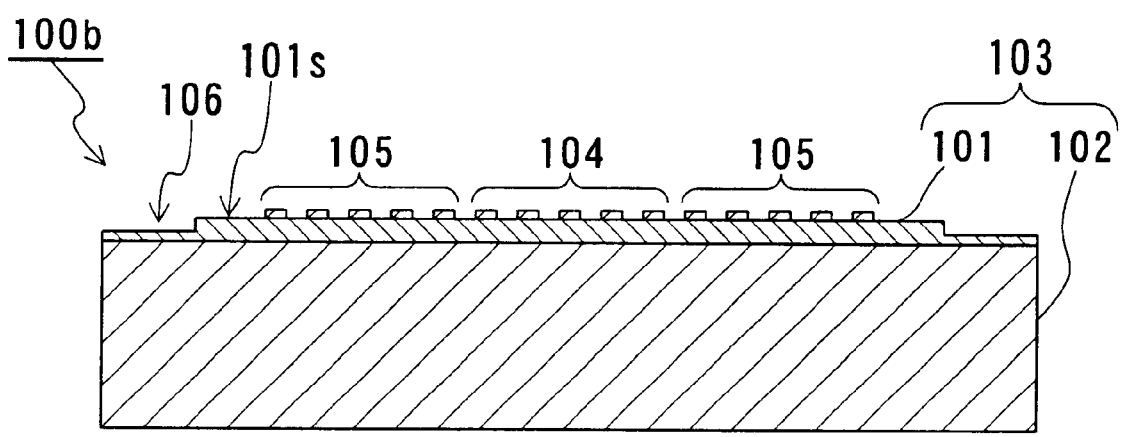
FIG. 3 is a cross-sectional view showing still another example of the surface acoustic wave element of the present invention.

FIGS. 1A and 1B show the case where the height of the step 106 is equal to the thickness of the first substrate 101. However, the height of the step 106 can be either larger or smaller than the thickness of the first substrate 101. FIG. 2 is a cross-sectional view of an element in the case where the height of the step 106 is larger than the thickness of the first substrate 101, and FIG. 3 is a cross-sectional view of an element in the case where the height of the step 106 is smaller than the thickness of the first substrate 101. In the surface acoustic wave element 100a in FIG. 2, the step 106 is formed from the first substrate 101 into the second substrate 102. In the surface acoustic wave element 100b in FIG. 3, the step 106 is formed only in the first substrate 101.

In the surface acoustic wave element 100 of Embodiment 1, the step 106 is formed on the periphery of the laminated substrate 103 on the side of the first substrate 101. For this reason, in handling the surface acoustic wave element 100, the surface acoustic wave element 100 can be picked up with a pincette, a vacuum chuck, etc. without touching the substrate 101 made of a piezoelectric material, so that the generation of defects of the first substrate 101 can be suppressed. Therefore, the surface acoustic wave element 100 of Embodiment 1 allows the element to be handled without touching the first substrate 101 and provides a surface acoustic wave element that can be handled easily, and has few defects.

Figure 4:
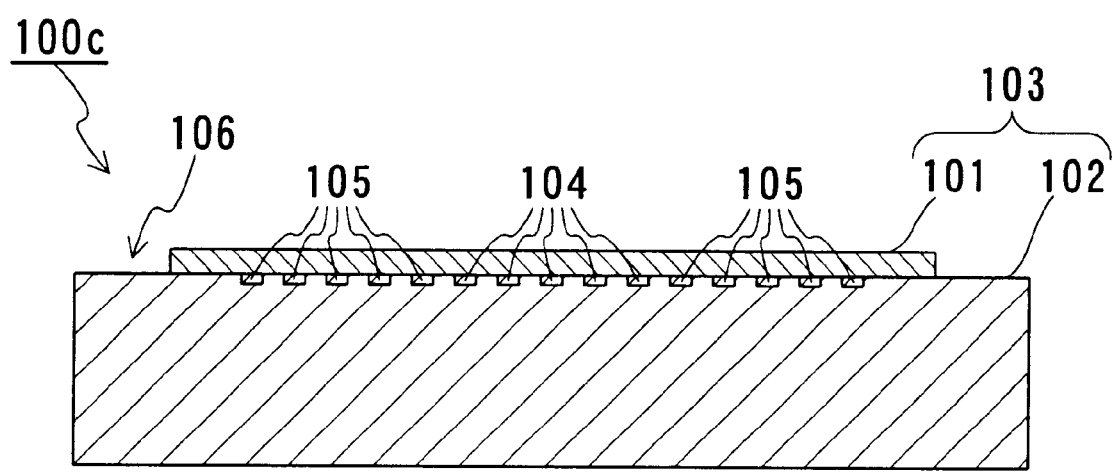
FIG. 4 is a cross-sectional view showing yet another example of the surface acoustic wave element of the present invention.

Although Embodiment 1 shows the case where the comb-shaped electrode 104 is formed on the surface 101s of the first substrate 101 (see FIG. 1), the comb-shaped electrode 104 can be formed on the main plane of the first substrate 101 on the side of the second substrate 102 (this applies also to the following embodiments). FIG. 4 shows a surface acoustic wave element 100c where the comb-shaped electrode 104 is formed on the main plane of the first substrate 101 on the side of the second substrate 102 (the interface between the first substrate 101 and the second substrate 102). This is a so-called boundary wave element. Also this case provides the same effects as the surface acoustic wave element 100 of Embodiment 1.

Figure 5A:
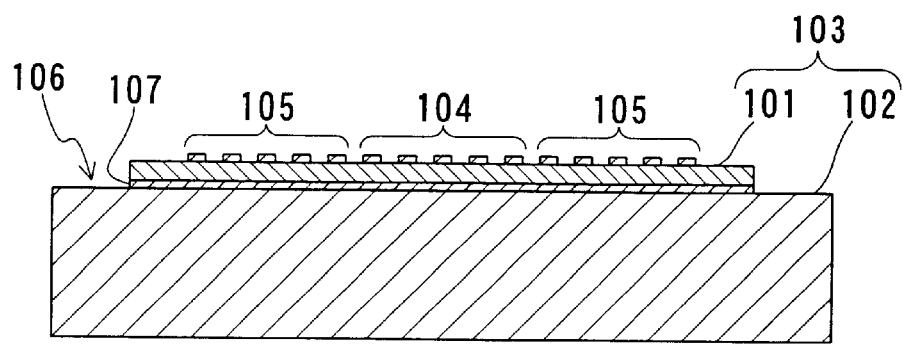
FIGS. 5A to 5C are cross-sectional views showing another example of the surface acoustic wave element of the present invention.
Figure 5B:
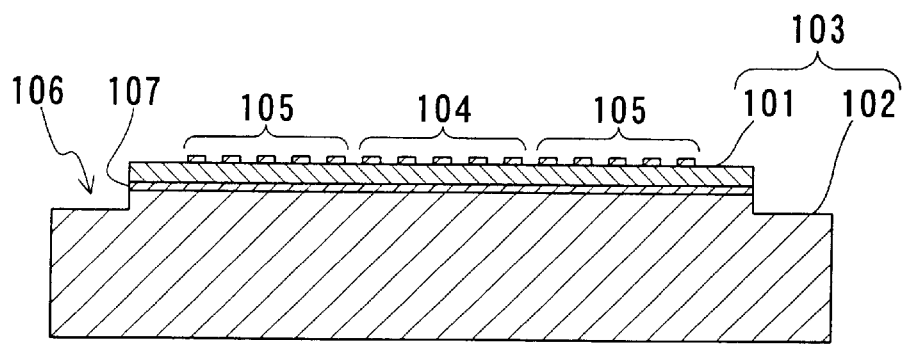
Figure 5C:
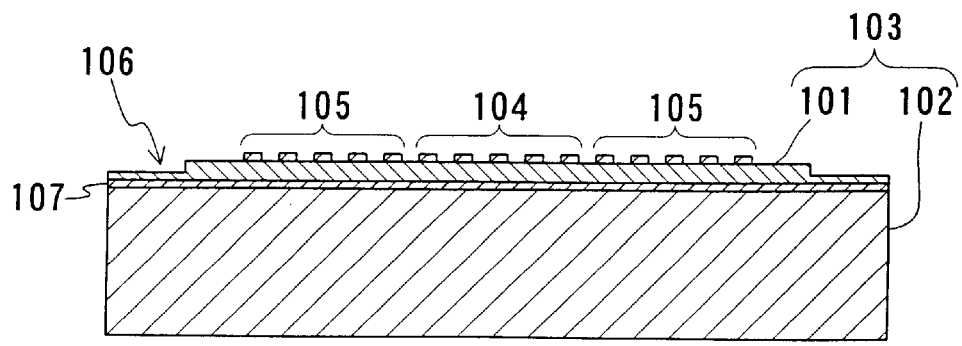

In Embodiment 1, the first substrate 101 and the second substrate 102 are laminated directly without any adhesive therebetween. However, the first substrate 101 and the second substrate 102 can be laminated with an adhesive therebetween (this applies also to the following embodiments). FIGS. 5A, 5B and 5C show cross-sectional views of the surface acoustic wave element in this case. The surface acoustic wave elements in FIGS. 5A, 5B and 5C correspond to the surface acoustic wave elements of FIGS. 1, 2 and 3, respectively. Referring to FIGS. 5A, 5B and 5C, the first substrate 101 is laminated over (joined to) the second substrate 102 via an adhesive 107. As the adhesive 107, an ultraviolet curable adhesive or a cold setting adhesive can be used, for example. The surface acoustic wave element shown in FIG. 5 provides the same effects as the surface acoustic wave element 100 of Embodiment 1.

Embodiment 2

In Embodiment 2, another example of the surface acoustic wave element of the present invention will be described. The description of the same parts as those described in Embodiment 1 will be omitted.

Figure 6A:
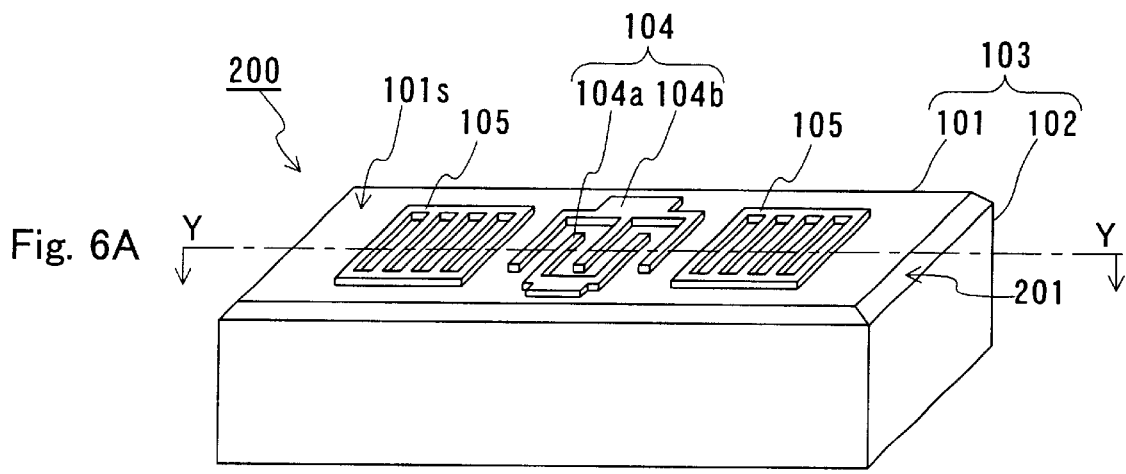
FIG. 6A is a perspective view showing still another example of the surface acoustic wave element of the present invention.
Figure 6B:
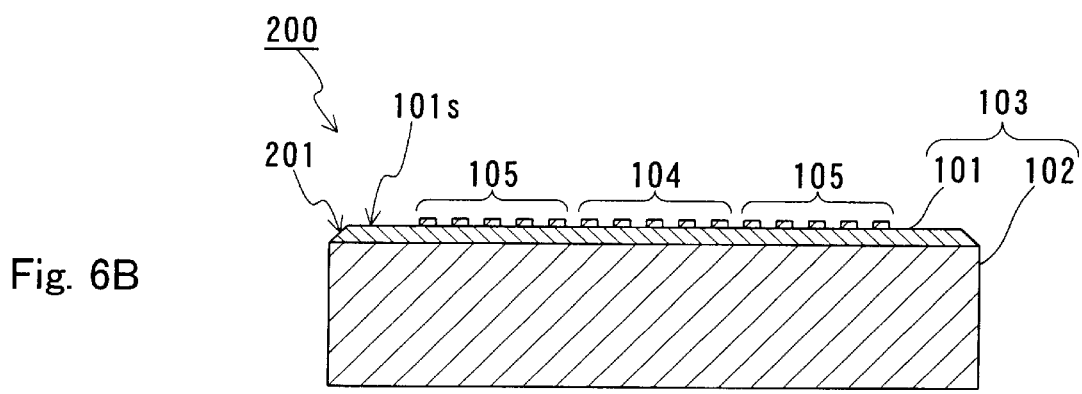
FIG. 6B is a cross-sectional view of the surface acoustic wave element of FIG. 6A.

FIG. 6A is a perspective view of a surface acoustic wave element 200 of Embodiment 2, and FIG. 6B is a cross-sectional view thereof taken along line Y—Y in FIG. 6A.

Referring to FIGS. 6A and 6B, the surface acoustic wave element 200 includes a laminated substrate 103 comprising a first substrate 101 and a second substrate 102, a comb-shaped electrode 104 formed on a surface 101s of the first substrate 101, and a reflector 105. A notch 201 is formed on the periphery of the laminated substrate 103 on the side of the first substrate 101.

The notch 201 is formed on the side face of the laminated substrate 103 where the comb-shaped electrode 104 is formed. In other words, the notch 201 is formed on the periphery of the laminated substrate 103 on the side of the first substrate 101. The formation of the notch makes the area of the surface of the first substrate 101 (the surface opposite to the face in contact with the second substrate 102) substantially smaller than that of the bottom face of the second substrate 102 (the face opposite to the face in contact with the first substrate 101).

Figure 7:
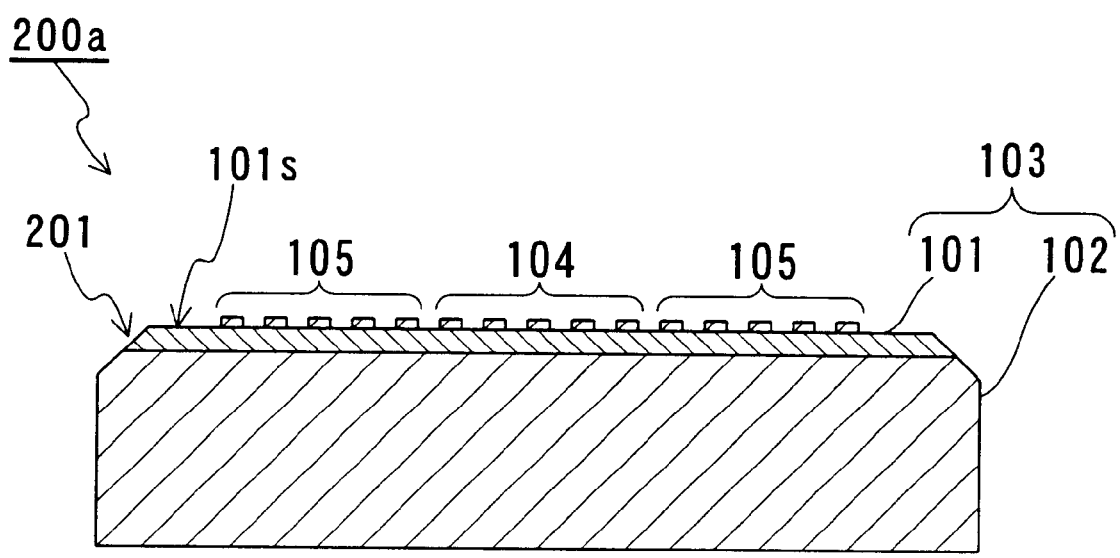
FIG. 7 is a cross-sectional view showing yet another example of the surface acoustic wave element of the present invention.
Figure 8:
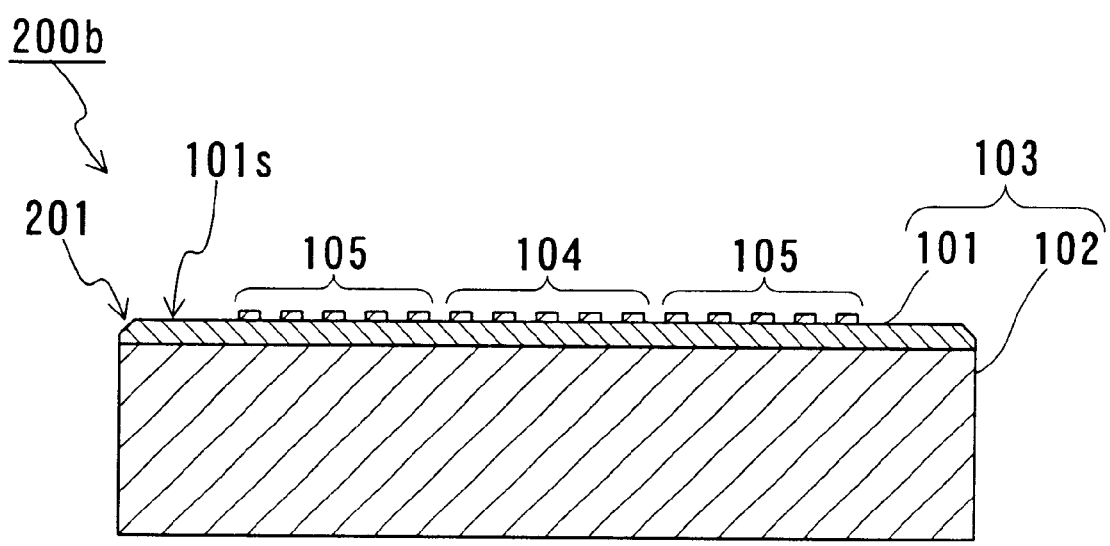
FIG. 8 is a cross-sectional view showing another example of the surface acoustic wave element of the present invention.

FIGS. 6A and 6B show the case where the height of the notch 201 is equal to the thickness of the first substrate 101. However, the height of the notch 201 can be either larger or smaller than the thickness of the first substrate 101. FIG. 7 is a cross-sectional view of an element in the case where the height of the notch 201 is larger than the thickness of the first substrate 101, and FIG. 8 is a cross-sectional view of an element in the case where the height of the notch 201 is smaller than the thickness of the first substrate 101. In the surface acoustic wave element 200a in FIG. 7, the notch 201 is formed from the first substrate 101 into the second substrate 102. In the surface acoustic wave element 200b in FIG. 8, the notch 201 is formed only in the first substrate 101.

In the surface acoustic wave element 200 of Embodiment 2, the notch 201 is formed on the periphery of the laminated substrate 103 on the side of the first substrate 101. Therefore, the surface acoustic wave element 200 of Embodiment 2 allows the element to be handled without touching the first substrate 101 made of a piezoelectric material and provides a surface acoustic wave element that can be handled easily, and has few defects.

Although Embodiment 2 shows the case where the comb-shaped electrode 104 is formed on the surface 101s of the first substrate 101, the comb-shaped electrode 104 can be formed on the main plane of the first substrate 101 on the side of the second substrate 102. Also this case provides the same effects as the surface acoustic wave element 200 of Embodiment 2.

In Embodiment 2, the first substrate 101 is laminated directly on (joined to) the second substrate 102 without any adhesive therebetween. However, the first substrate 101 can be laminated over (joined to) the second substrate 102 with an adhesive therebetween. Also this case provides the same effects as the surface acoustic wave element 200 of Embodiment 2.

Embodiment 3

In Embodiment 3, an example of a method for producing the surface acoustic wave element 100 described in Embodiment 1 will be described. The description of the same parts as those described in Embodiment 1 will be omitted.

Figure 9A:
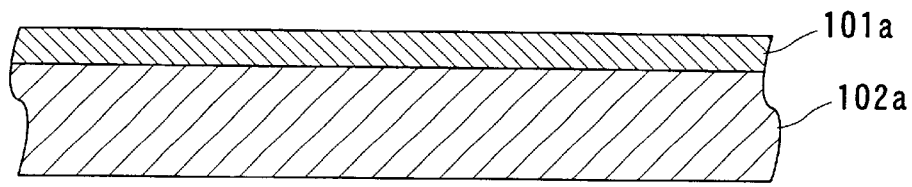
FIGS. 9A to 9E show a process sequence of an example of a method for producing a surface acoustic wave element of the present invention.

Referring to FIGS. 9A to 9E, in the method of Embodiment 3, first, as shown in FIG. 9A, a first substrate 101a (having a thickness of, for example 0.2 mm), which will be the first substrate 101, is laminated directly on coined to) a second substrate 102a (having a thickness of, for example 1 mm), which will be the second substrate 102. In this embodiment, the first substrate 101a having a thickness of 0.2 mm and the second substrate 102a having a thickness of 1 mm are used as the starting materials and joined together.

However, this is only an example, and the materials can be selected in view of handling in a substrate cleaning process, ensuring parallelism and smoothness of each substrate, or the like. There are no particular limitations regarding the thickness.

An example of a method for laminating the first substrate 101a directly on the second substrate 102a will be described below. First, the first substrate 101a and the second substrate 102a whose surfaces are smoothed and cleaned are prepared. The surface of each substrate is treated with, for example an ammonia-based aqueous solution so as to be hydrophilic. Then, each substrate is rinsed with pure water and dried. It is preferable to use a spinning dryer or the like for drying. This process makes the surface of each substrate to have terminal hydroxyl groups (—OH) so that it becomes hydrophilic.

Then, one main plane of the hydrophilic first substrate 101a is opposed to and is superimposed on one main plane of the hydrophilic second substrate 102a. Thus, the first substrate 101a and the second substrate 102a are joined together primarily via hydrogen bonds (initial joining). In this stage, the joining strength is not sufficient so that the initially joined substrates are treated with heat for higher joining strength. This thermal treatment changes the initial joining to joining primarily by intermolecular force so that a firmly joined body can be obtained. In superimposing the substrates, the substrates are not necessarily dry and can be superimposed with water therebetween without drying the surfaces of the substrates, and then treated with heat.

Figure 9B:
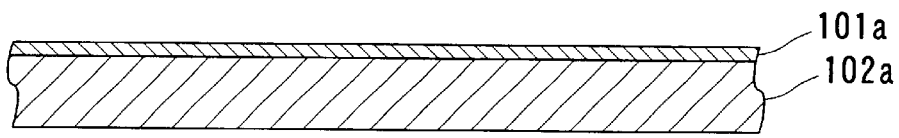

Thereafter, as shown in FIG. 9B, the first substrate 101a and the second substrate 102a are reduced in thickness until they have suitable thicknesses. It is necessary to provide the first substrate 101 and the second substrate 102 with predetermined thicknesses (for example, the thickness of the first substrate 101 is 0.03 mm, and the thickness of the second substrate 102 is 0.32 mm) in accordance with the purpose of the substrates. Therefore, the first and second substrates 101a and 102a that are joined together without anything therebetween are made thin by mechanical grinding or polishing until the predetermined thicknesses are reached. The laminated first and second substrates 101a and 102a that are joined together without anything therebetween have a joining strength sufficiently resistant to conventional mechanical grinding and polishing, so that the substrates are not detached in the process of making the substrates thin.

In the process of making the substrates thin, more specifically, the following processes are included. A surface acoustic wave propagates on the surface of the first substrate 101a. Therefore, after the first substrate 101a is made thin by mechanical grinding until a certain thickness, for example about 0.1 mm, is reached, the surface of the first substrate 101a is polished to a mirror finish by regular mechanochemical polishing, which is performed until the final thickness reaches the predetermined thickness (e.g., 0.03 mm). The second substrate 102a is made thin only by mechanical grinding until the predetermined thickness is reached.

In FIGS. 9A and 9B, after the initially joined substrates are treated with heat, the process of making them thin is performed. Alternatively, depending on the combination of the substrates or the final thickness of the substrates, the temperature of the heat treatment can be raised stepwise while repeating the heat treatment and the process of making the substrate thin several times. This can provide a laminated substrate having a high joining strength.

The above-described processes provide a laminated substrate comprising the first substrate 101a made of a piezoelectric material such as a piezoelectric single crystal and the second substrate 102a made of glass having a low thermal expansion coefficient.

Figure 9C:
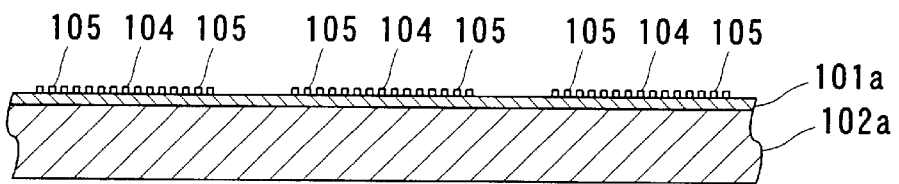

Thereafter, as shown in FIG. 9C, the comb-shaped electrode 104 and the reflector 105 are formed on the surface 101s of the first substrate 101a. The comb-shaped electrode 104 and the reflector 105 can be formed by a conventional photolithography technique. In this manner, a laminated substrate is provided where the first substrate 101a and the second substrate 102a are laminated, and the comb-shaped electrodes 104 are formed. Generally, up to this process, the processes are performed by wafer unit, and a wafer is separated into elements by the subsequent process. As described above, the method of Embodiment 3 includes forming the laminated substrate where the first substrate 101a made of a piezoelectric material and provided with a pair of comb-shaped electrodes 104 on a surface 101s thereof is laminated on the second substrate 102a made of a material different from the first substrate 101a.

Figure 9D:
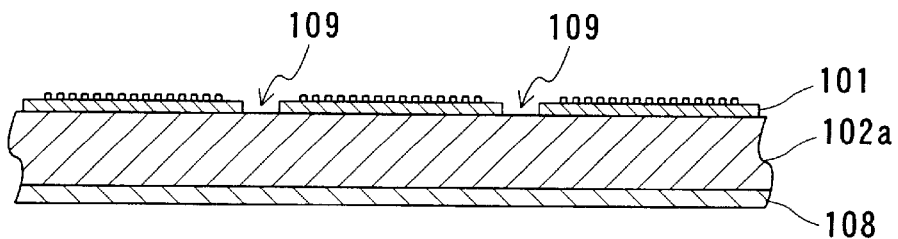
Figure 9E:
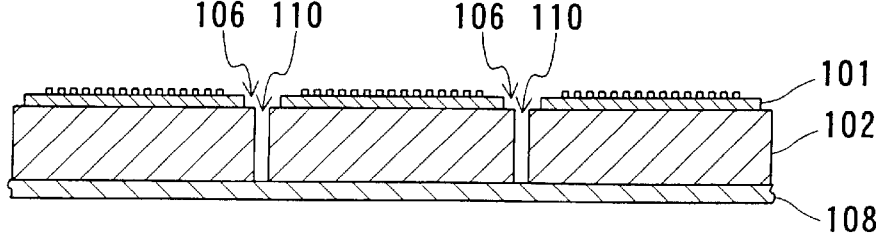

Thereafter, as shown in FIGS. 9D and 9E, the wafer is cut (separated into elements) by the following two processes. The process of separating into elements will be described below.

First, as shown in FIG. 9D, the laminated substrate including the first substrate 101a and the second substrate 102a is fixed onto a base film 108 for wafer fixture, and then a groove 109 is formed in a portion around the comb-shaped electrode 104 on the side of the first substrate 101a of the laminated substrate. The groove 109 can be formed by grinding the substrate 101a. The first substrate 101a is cut by the groove 109 so as to form the first substrate 101. The portion removed by grinding the first substrate 101a corresponds to the portion that divides elements. For this grinding (cutting) of the first substrate 101a, for example, a cutting blade having a thickness of 0.2 mm and an abrasive grain size of 8.5±0.7 μm (on the 50 % cumulative height level: JIS R6001, ISO8486-1, ISO8486-2) can be used. The surface acoustic wave element shown in FIG. 2 can be produced by making the depth of the groove 109 larger than the thickness of the first substrate 101a. The surface acoustic wave element shown in FIG. 3 can be produced by making the depth of the groove 109 smaller than the thickness of the first substrate 101a.

The removal in the first substrate 101a can be performed by etching. In this case, a part of the first substrate 101a can be removed by regular photolithography and etching.

Thereafter, as shown in FIG. 9E, the substrate is separated into elements by grinding for cutting approximately at the center of the groove 109 formed in the process of FIG. 9D in a width narrower than that of the groove 109 on the laminated substrate including the first substrate 101a and the second substrate 102a. In this case, for example, a cutting blade thinner than the cutting blade used in the grinding process of FIG. 9D, for example, a cutting blade having a thickness of 0.08 mm, is used to cut the substrate in such a manner that the center of the formed groove 110 (second cut groove) substantially matches the center of the groove 109. The cut second substrate 102a becomes the second substrate 102. The portion removed when the groove 109 is formed serves as the step 106.

Thereafter, each element is separated from the base film 108 so that the surface acoustic wave element 100 provided with the step 106 on the periphery of the first substrate 101 can be obtained.

In the above-described process of grinding and cutting the first substrate 101a, when a cutting blade having a fine abrasive grain suitable for the mechanical nature of the piezoelectric single crystal used for the first substrate 101a is used to cut the first substrate 101a, defects as a result of chipping or substrate fracturing can be suppressed. On the other hand, the second substrate 102a is made of glass or the like, which is a relatively soft material. Therefore, when the second substrate 102a is cut with the same cutting blade as used for the first substrate 101a, the cutting blade wears significantly, and clogging occurs so that the blade may be damaged. Therefore, in the process of cutting the second substrate 102a, it is preferable to use a cutting blade having rough abrasive grains, for example, of a grain size of 24.0±1.5 μm (on the 50% cumulative height level). In other words, when the second substrate 102a is cut with a cutting blade having an abrasive grain size larger than that of the cutting blade used for cutting the first substrate 101a, the lifetime of the cutting blade can be prolonged, and the surface acoustic wave element can be produced in high productivity and a low cost.

There are no limitations regarding the width, the material and the abrasive grain size of the cutting blade used in the processes in FIGS. 9D and 9E, and any cutting blade suitable for materials for the substrates can be used, as long as the step 106 can be formed.

The cutting speed (grinding speed) at which the first substrate 101a is cut is preferably low to suppress the generation of the defects of the surface acoustic wave element, and for example, the first substrate 101a can be cut at 2 mm/sec. Similarly, as the cutting speed (grinding) at which the second substrate 102a is cut is lower, the cut plane becomes better. However, in view of the productivity, it is preferable that it is faster than that of the cutting speed of the first substrate 101a. For example, the second substrate 102a can be cut at a cutting speed of 4 mm/sec. In the method of Embodiment 3, the groove 109 having a large width is formed in the first substrate 101a in the cutting process of FIG. 9D. Therefore, even if the cutting speed in the cutting process of FIG. 9E is faster than that of FIG. 9D, there is no adverse effect on the first substrate 101 such as wafer chipping. In other words, even if chipping occurs in the process of cutting the second substrate 102a, chipping in the first substrate 101 does not occur across the juncture boundary between the first substrate 101 and the second substrate 102a. Thus, the first substrate 101a is ground at a speed slower than that for grinding the second substrate 102a, so that a surface acoustic wave element with few defects can be obtained. Furthermore, the second substrate 102a is ground at a speed faster than that for grinding the first substrate 101a, so that a surface acoustic wave element can be produced in a high productivity and a low cost.

The method of Embodiment 3 allows the surface acoustic wave element 100 described in Embodiment 1 to be produced easily. Furthermore, the method of Embodiment 3 allows the surface acoustic wave element to be produced in high reliability, a high yield and a low cost, because no chipping in the substrate made of a piezoelectric material occurs in the production process.

With reference to FIGS. 9A to 9E, the method for producing the surface acoustic wave element 100 shown in FIG. 1 has been described. For the production of the surface acoustic wave element shown in FIG. 4, the comb-shaped electrode 104 and the reflector 105 are formed on the first substrate 101a or the second substrate 102a, and then the first substrate 101a and the second substrate 102a are laminated (this applies also to the following embodiments). In this case, first, recesses may be formed on the first substrate 101a or the second substrate 102a, and then the comb-shaped electrode 104 and the reflector 105 may be formed in the recesses.

Furthermore, although FIGS. 9A to 9E show the manner in which the surface acoustic wave element 100 shown in FIG. 1 is produced, for the production of the surface acoustic wave element shown in FIG. 5, the first substrate 101a and the second substrate 102a can be adhered with an adhesive (this applies also to the following embodiments).

Embodiment 4

In Embodiment 4, an example of a method for producing the surface acoustic wave element 200 described in Embodiment 2 will be described. The description of the same parts as those described in the above embodiments will be omitted.

Figure 10A:
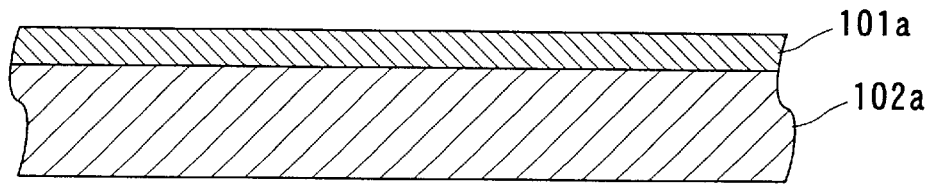
FIGS. 10A to 10E show a process sequence of another example of a method for producing a surface acoustic wave element of the present invention.

Referring to FIGS. 10A to 10E, in the method of Embodiment 4, first, the first substrate 101a, which will be the first substrate 101, and the second substrate 102a, which will be the second substrate 102, are joined together, as shown in FIG. 10A.

Figure 10B:
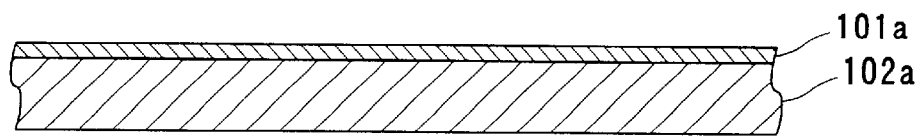

Thereafter, as shown in FIG. 10B, the first substrate 101a and the second substrate 102a are reduced to suitable thicknesses.

Figure 10C:
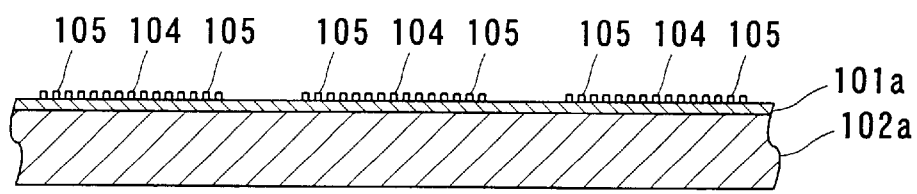

Then, as shown in FIG. 10C, the comb-shaped electrode 104 and the reflector 105 are formed on the main plane of the first substrate 101a on the side of its surface. The processes of FIGS. 10A to 10C are the same as those described in Embodiment 3.

Figure 10D:
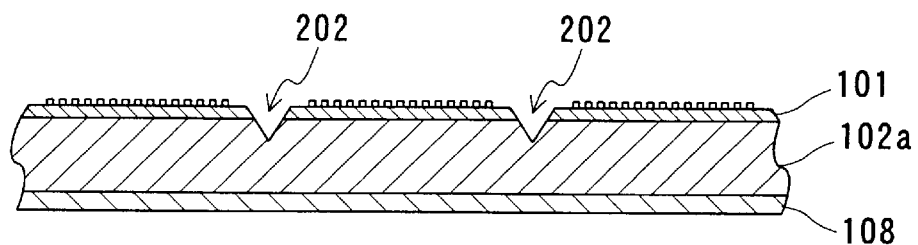
Figure 10E:
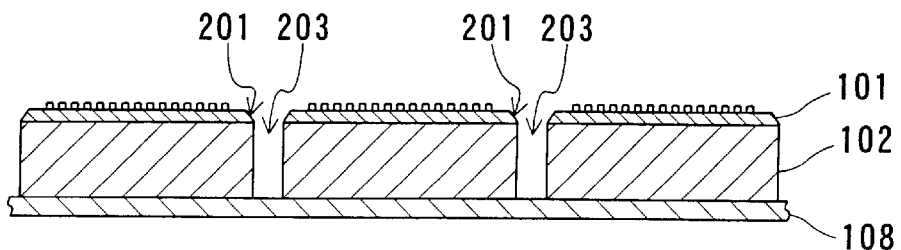

Thereafter, as shown in FIGS. 10D and 10E, the wafer is cut (separated into elements) by the following two processes. The process of separating into elements will be described below.

First, as shown in FIG. 10D, the laminated substrate including the first substrate 101a and the second substrate 102a is fixed onto a base film 108 for wafer fixture, and then a groove 202 having an approximately Vshaped cross section is formed by grinding and removing a portion around the comb-shaped electrode 104 on the side of the first substrate 101a of the laminated substrate. The first substrate 101a is cut by the groove 202 so as to form the first substrate 101. The portion removed by grinding the first substrate 101a corresponds to the portion that divides elements. The processes in this case are the same as those of FIG. 9D described in Embodiment 3, except that the cutting blade is replaced by a V-shaped cutting blade.

Thereafter, as shown in FIG. 10E, the substrate is separated into elements by grinding for cutting approximately at the center of the groove 202 formed in the process of FIG. 10D in a width narrower than that of the groove 202 on the laminated substrate including the first substrate 101a and the second substrate 102a. The cutting in this case, for example, can be performed with a cutting blade thinner than the cutting blade used in the grinding process of FIG. 10D in such a manner that the center of the formed groove 203 (second cut groove) substantially matches the center of the groove 202. The cut second substrate 102a becomes the second substrate 102. The surface acoustic wave element shown in FIG. 7 or 8 can be produced by changing the shape of the groove 202 and the width of the groove 203.

The above-described processes provide the surface acoustic wave element 200 provided with a notch 201 on the periphery of the first substrate 101.

The method of Embodiment 4 allows the surface acoustic wave element 200 described in Embodiment 2 to be produced easily. Furthermore, the method of Embodiment 4 allows the surface acoustic wave element to be produced in high reliability, a high yield and a low cost, because no chipping in the substrate made of a piezoelectric material occurs in the production process.

Embodiment 5

Figure 11:
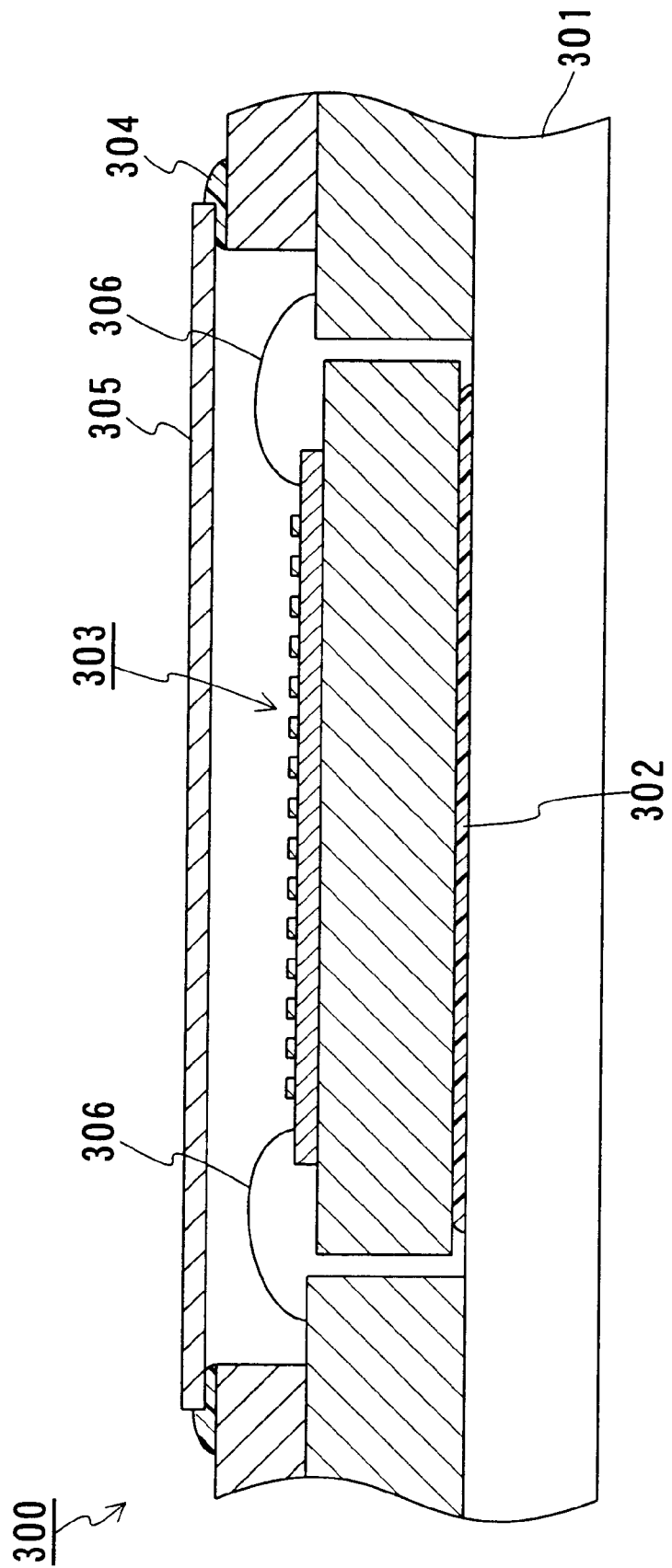
FIG. 11 is a cross-sectional view showing an example of a surface acoustic wave device of the present invention.
Figure 12:
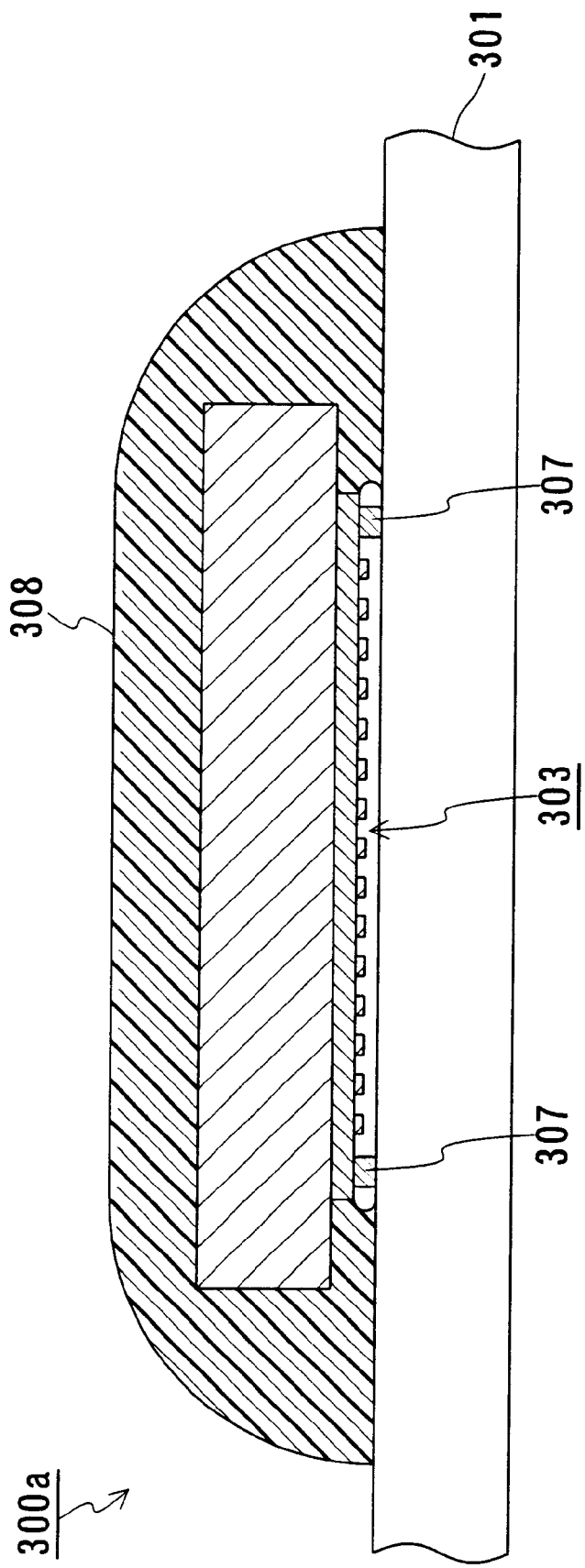
FIG. 12 is a cross-sectional view showing another example of a surface acoustic wave device of the present invention.
Figure 13A:
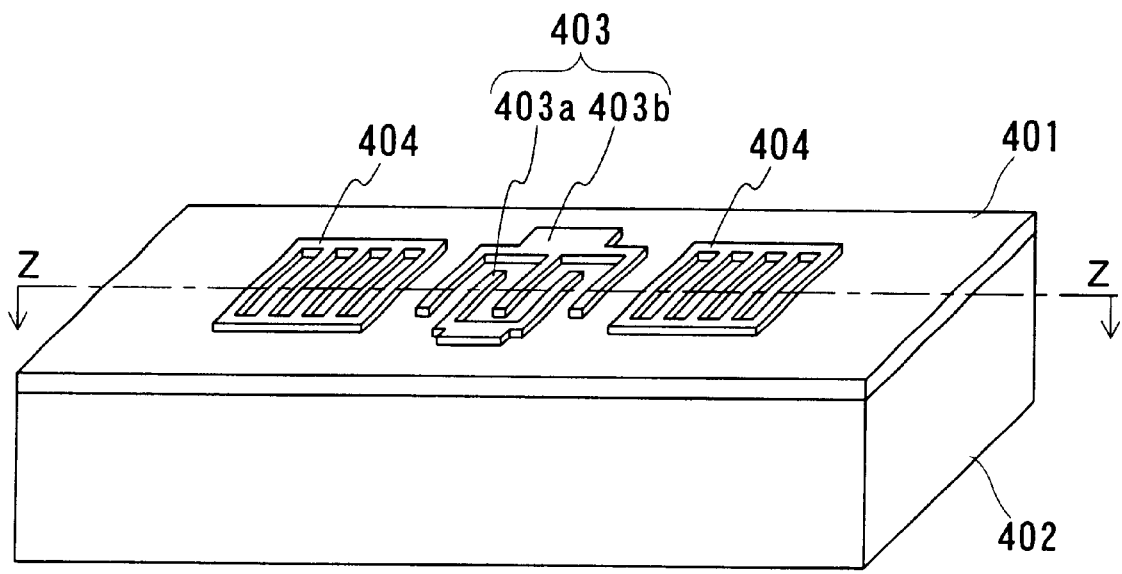
FIG. 13A is a perspective view of an example of a conventional surface acoustic wave element.
Figure 13B:
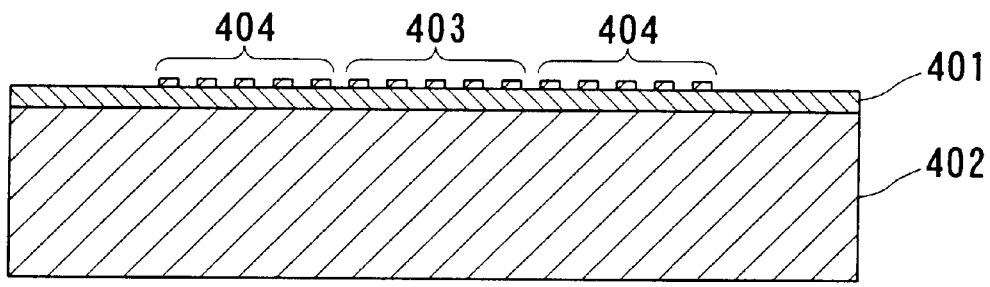
FIG. 13B is a cross-sectional view thereof.

In Embodiment 5, the surface acoustic wave device of the present invention will be described by two examples. FIG. 11 is a cross-sectional view of an example of the surface acoustic wave device of Embodiment 5, and FIG. 12 is a cross-sectional view of another example thereof.

A surface acoustic wave device 300 of FIG. 11 includes a circuit board 301 (hatching is omitted) and a surface acoustic wave element 303 fixed onto the circuit board 301 with an adhesive 302. The surface acoustic wave element 303 can be fixed onto the package. The portion above the surface acoustic wave element 303 is sealed by an adhesive 304 and a lid 305 to ensure airtightness of the periphery of the surface acoustic wave element. The lid 305 can be welded with solder. The circuit board 301 and the surface acoustic wave element 303 are connected electrically by a metal wire 306. The surface acoustic wave device 300 is provided with other electronic components, if necessary.

For the circuit board 301, for example, a multilayered substrate comprising alumina or low-temperature sintered ceramics can be used. For the lid 305, a lid made of metal or ceramics can be used. For the metal wire 306, a wire made of aluminum or gold can be used.

The surface acoustic wave element 303 is one of the surface acoustic wave elements of the present invention described in Embodiment 1 or 2. As shown in FIG. 11, the surface acoustic wave element 303 is mounted on the circuit board 301 in the face-up manner.

The surface acoustic wave element 303 can be mounted in the facedown manner. Such a surface acoustic wave device 300a is shown in FIG. 12. In the surface acoustic wave device 300a, the surface acoustic wave element 303 is connected electrically to electric wiring (not shown) on the circuit board 301 through conductive bumps 307. The surface acoustic wave element 303 is sealed by a sealing resin 308. In order to obtain vibration space, a space is provided between the surface acoustic wave element 303 and the circuit board 301.

An example of a method of mounting in the face-down manner will be described below. First, the conductive bumps 307 are formed on the surface acoustic wave element 303. Thereafter, the functioning portion of the surface acoustic wave element 303 is opposed to the circuit board 301 and they are electrically connected. The surface acoustic wave element 303 and the circuit board 301 can be electrically connected, for example, by applying ultrasonic waves, using a conductive adhesive, or using solder. Thereafter, the periphery of the functioning portion of the surface acoustic wave element 303 is sealed airtightly, for example, by applying and curing an epoxy-based sealing resin 308. Alternatively, a lid made of metal or ceramics can be provided to seal the periphery of the functioning portion of the surface acoustic wave element 303.

The surface acoustic wave device of the present invention uses the surface acoustic wave element of the present invention. Therefore, the present invention provides a surface acoustic wave device that can be produced easily in a high yield, and has high reliability. In particular, in the surface acoustic wave device 300a, the step acts as a dam in sealing the surface acoustic wave element 303 with the sealing resin 308, so that the sealing resin 308 can be prevented from entering the function portion (vibration region). Thus, even if the viscosity of the sealing resin 308 is changed, the vibration space is ensured without fail, and therefore a surface acoustic wave device whose characteristics do not degrade can be obtained.

The surface acoustic wave device of the present invention can be used as a surface acoustic wave filter in mobile communication equipment such as a cellular phone. The surface acoustic wave filter can pass only signals with desired frequencies, so that it has becomes a key device of a wireless circuit. A general surface acoustic wave device is more excellent in selectivity than a dielectric filter. However, the recent rapid development of mobile communication requires higher selectivity, and the characteristics of a conventional surface acoustic wave device depends significantly on temperature. On the other hand, since the surface acoustic wave device of the present invention includes the surface acoustic wave element 303 using the laminated substrate, the temperature characteristics are good and the selectivity of the frequency is high.

Furthermore, the surface acoustic wave device of the present invention can be used also in a vibrator for keyless entry of an automobile.

EXAMPLES

Example 1

In Example 1, an example of the surface acoustic wave element shown in FIG. 1 will be described.

In the surface acoustic wave element of Example 1, a 36° Y-cut X-propagating lithium tantalate (0.03 mm thick) was used as the first substrate 101. As the second substrate 102, glass (0.32 mm thick) having a thermal expansion coefficient smaller than that of the first substrate 101 in the surface acoustic wave propagation direction was used. The first substrate 101 and the second substrate 102 were joined together substantially directly without an adhesive or the like therebetween.

An example of the surface acoustic wave element of Example 1 produced by the method described in Embodiment 3 will be described below.

First, the first substrate 101a (0.2 mm thick) and the second substrate 102a (1 mm thick) whose surfaces had been smoothed and cleaned beforehand were prepared. The surface of each substrate was treated with an ammonia-based aqueous solution so as to be hydrophilic. Then, each substrate was rinsed with pure water and dried. A spinning dryer or the like was used for drying. This process made the surface of each substrate to have terminal hydroxyl groups (—OH) so that it became hydrophilic.

Then, one main plane of the hydrophilic first substrate 101a was opposed to and superimposed on one main plane of the hydrophilic second substrate 102a. Thus, the first substrate 101a and the second substrate 102a were joined together primarily via hydrogen bonds. Thereafter, the joining strength was improved by performing a heat treatment at 200° C. for 120 min.

Then, the first substrate 101a and the second substrate 102a were reduced in thickness until the predetermined thicknesses (0.03 mm and 0.32 mm) were reached. The substrates were made thin by mechanical grinding and polishing.

A surface acoustic wave propagates on the surface of the first substrate 101a. Therefore, after the first substrate 101a was made thin by mechanical grinding until a certain thinness, for example about 0.1 mm, was reached, the surface of the first substrate 101a was polished to a mirror finish by regular mechanochemical polishing, which was performed until the final thickness reached the predetermined thickness of 0.03 mm. The second substrate 102a was made thin using only mechanical grinding until the predetermined thickness was reached.

The above-described processes provided a laminated substrate including the first substrate 101a made of a piezoelectric single crystal and the second substrate 102*a* made of glass having a low thermal expansion coefficient.

Then, the comb-shaped electrode 104 and the reflector 105 were formed on the surface of the first substrate 101*a* by a conventional photolithography technique.

Then, the wafer was cut (separated into elements). First, the laminated substrate was fixed onto a base film 108.

Then, a groove 109 having a depth equal to the thickness of the first substrate 101*a* was formed in the first cutting process. In this example, the groove 109 was formed (the first substrate 101*a* was cut) with a cutting blade having a thickness of 0.2 mm and an abrasive grain size of 8.5±0.7 $\mu$m (on the 50% cumulative height level).

Then, in the second cutting process, a groove 110 was formed with a cutting blade having a thickness of 0.08 mm, i.e., thinner than that in the first cutting process. In this case, the wafer was separated into elements in such a manner that the center of the formed groove 110 (second cut groove) substantially matched the center of the groove 109.

In this manner, a surface acoustic wave element provided with a step 106 having a width of about 0.05 mm on the periphery of the substrate 101 was obtained.

In the first cutting process, when a cutting blade having a fine abrasive grain suitable for the mechanical nature of the piezoelectric single crystal used for the first substrate is used to cut the first substrate, defects as a result of chipping or substrate fracturing can be suppressed. On the other hand, when the second substrate made of glass or the like, which is a relatively soft material, is cut with the same cutting blade as used for the first substrate, the cutting blade wears significantly, and clogging occurs so that the blade may be damaged. Therefore, in the second cutting process, it is preferable to use a cutting blade having rough abrasive grains, for example, of a grain size of about 24.0±1.5 $\mu$m.

The cutting speed in the first cutting process is preferably low to suppress the generation of defects of the surface acoustic wave element. In Example 1, the cutting was performed at 2 mm/sec. Similarly, in cutting the second substrate, the lower cutting speed provides the better cut plane. However, in view of the productivity, in Example 1, the cutting was performed at 4 mm/sec. In Example 1, since the groove 109 is formed in the first cutting process, even if the cutting speed in the second cutting process is faster than that in the first cutting process, there is no adverse effect on the first substrate 101 such as wafer chipping. In other words, even if chipping occurs in the process of cutting the second substrate 102*a*, chipping in the first substrate 101 does not occur across the juncture boundary between the first substrate 101 and the second substrate 102.

Example 2

In Example 2, an example of the surface acoustic wave element shown in FIG. 2 will be described.

In the surface acoustic wave element of Example 2, a 64° Y-cut X-propagating lithium niobate (0.02 mm thick) was used as the first substrate 101. As the second substrate 102, glass (0.33 mm thick) having a thermal expansion coefficient smaller than that of the first substrate 101 in the surface acoustic wave propagation direction was used. The first substrate 101 and the second substrate 102 were joined together substantially directly without an adhesive or the like therebetween.

An example of the surface acoustic wave element of Example 2 produced by the method described in Embodiment 3 will be described below.

First, the first substrate 101*a* (0.2 mm thick) and the second substrate 102*a* (1 mm thick) were joined together. The process for this was performed in the same manner as in Example 1. Thus, a laminated substrate including the first substrate 101*a* made of a piezoelectric single crystal and the second substrate 102*a* made of glass having a low thermal expansion coefficient was obtained.

Then, the first substrate 101*a* and the second substrate 102*a* were reduced in thickness until the predetermined thicknesses (0.02 mm and 0.33 mm) were reached. The substrates were made thin by mechanical grinding and polishing.

A surface acoustic wave propagates on the surface of the first substrate 101*a*. Therefore, after the first substrate 101*a* was made thin by mechanical grinding until a certain thinness, for example about 0.1 mm, was reached, the surface of the first substrate was polished to a mirror finish by regular mechanochemical polishing, which was performed until the final thickness reached the predetermined thickness of 0.02 mm. The second substrate 102*a* was made thin only by mechanical grinding until the predetermined thickness was reached.

Then, the comb-shaped electrode 104 and the reflector 105 were formed on the surface of the first substrate 101*a* by a conventional photolithography technique. Up to this process, the processes were performed by wafer unit.

Then, the wafer was cut (separated into elements) in the first and second cutting processes in the same manner as in Example 1. However, in Example 2, the groove 109 formed in the first cutting process was formed about 0.03 mm deeper from the juncture interface between the first substrate 101*a* and the second substrate 102*a*. In Example 2, the first cutting process was performed with a cutting blade having a thickness of 0.2 mm and an abrasive grain size of 8.5±0.7 $\mu$m (on the 50% cumulative height level).

Then, in the second cutting process, a groove 110 was formed with a cutting blade thinner than that in the first cutting process, for example a cutting blade having a thickness of 0.08 mm. In this case, the wafer was separated into elements in such a manner that the center of the formed groove 110 (second cut groove) substantially matched the center of the groove 109.

In this manner, a surface acoustic wave element provided with a step 106 having a width of about 0.05 mm on the periphery of the substrate 101 was obtained.

Example 3

In Example 3, an example of the surface acoustic wave element shown in FIG. 3 will be described.

In the surface acoustic wave element of Example 3, a 41° Y-cut X-propagating lithium niobate (0.10 mm thick) was used as the first substrate 101. As the second substrate 102, glass (0.25 mm thick) having a thermal expansion coefficient smaller than that of the first substrate 101 in the surface acoustic wave propagation direction was used. The first substrate 101 and the second substrate 102 were joined together substantially directly without an adhesive or the like therebetween.

An example of the surface acoustic wave element of Example 3 produced by the method described in Embodiment 3 will be described below.

First, the first substrate 101*a* (0.2 mm thick) and the second substrate 102*a* (1 mm thick) were joined together. The process for this was performed in the same manner as in Example 1. Thus, a laminated substrate including the first substrate 101a made of a piezoelectric single crystal and the second substrate 102a made of glass having a low thermal expansion coefficient was obtained.

Then, the first substrate 101a and the second substrate 102a were reduced in thickness until the predetermined thicknesses (0.10 mm and 0.25 mm) were reached. The substrates were made thin by mechanical grinding and polishing.

Since a surface acoustic wave propagates on the surface of the first substrate 101a, the surface of the first substrate 101a was polished to a mirror finish by regular mechanochemical polishing, which was performed until the final thickness reached the predetermined thickness of 0.10 mm. The second substrate 102a was made thin only by mechanical grinding until the predetermined thickness was reached.

Then, the comb-shaped electrode 104 was formed on the surface of the first substrate 101a by a conventional photolithography technique. Up to this process, the processes were performed by wafer unit.

Then, the wafer was cut (separated into elements) in the first and second cutting processes in the same manner as in Example 1. However, in Example 3, the groove 109 formed in the first cutting process was formed about 0.05 mm deep from the surface of the first substrate 101a (the depth does not reach the interface between the first substrate 101a and the second substrate 102a). In Example 3, the first cutting process was performed with a cutting blade having a thickness of 0.2 mm and an abrasive grain size of 8.5±0.7 $\mu$m (on the 50% cumulative height level).

Then, in the second cutting process, using a cutting blade thinner than that in the first cutting process, for example a cutting blade having a thickness of 0.08 mm, a groove 110 was formed in such a manner that the center of the formed groove 110 (second cut groove) substantially matched the center of the groove 109. Thus, the wafer was separated into elements.

In this manner, a surface acoustic wave element provided with a step 106 having a width of about 0.05 mm on the periphery of the substrate 101 was obtained.

The embodiments of the present invention have been described by way of examples. However, the present invention is not limited to the above embodiments and may be embodied in other forms without departing from the spirit or essential characteristics thereof For example, in the above embodiments, the surface acoustic wave elements are provided with the reflector, but the present invention can applied to surface acoustic wave elements without the reflector.

The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A surface acoustic wave element comprising a laminated substrate where a first substrate made of a piezoelectric material is laminated over a second substrate made of a material different from that of the first substrate, comprising at least one pair of comb-shaped electrodes for exciting a surface acoustic wave, which is formed on one main plane of the first substrate, wherein a step or a notch is formed on a periphery of the laminated substrate on a side of the first substrate, the step or notch being formed from the first substrate into the second substrate, the second substrate has a thermal expansion coefficient smaller than a thermal expansion coefficient of the first substrate in a propagation direction of the surface acoustic wave, and a thickness of the first substrate is in a range of 5 $\mu$m to 100 $\mu$m, and a thickness of the second substrate is in a range of 200 $\mu$m to 400 $\mu$m.

2. The surface acoustic wave element according to claim 1, wherein the first substrate is made of a piezoelectric single crystal.

3. The surface acoustic wave element according to claim 1, wherein the second substrate is made of glass.

4. The surface acoustic wave element according to claim 1, wherein the first substrate is laminated directly on the second substrate.

5. The surface acoustic wave element according to claim 1, wherein the first substrate is laminated over the second substrate via an adhesive.

6. A surface acoustic wave device comprising a substrate and a surface acoustic wave element mounted on the substrate, wherein the surface acoustic wave element is the surface acoustic wave element according to claim 1.

7. The surface acoustic wave device according to claim 6, wherein the first substrate is made of a piezoelectric single crystal.

8. The surface acoustic wave device according to claim 6, wherein the second substrate is made of glass.

9. The surface acoustic wave device according to claim 6, wherein the first substrate is laminated directly on the second substrate.

10. The surface acoustic wave device according to claim 6, wherein the first substrate is laminated over the second substrate via an adhesive.

11. The surface acoustic wave device according to claim 6, wherein the surface acoustic wave element is mounted on the substrate in a face-down manner.

12. A method for producing a surface acoustic wave element, comprising:

(a) forming a laminated substrate where a first substrate made of a piezoelectric material and provided with a pair of comb-link electrodes on one main plane thereof is laminated over a second substrate made of a material different from that of the first substrate;

(b) forming a groove on a portion around the comb-shaped electrodes of the laminated substrate, wherein the portion removed when the groove is formed forms a step or notch, said step or notch being formed from the first substrate into the second substrate; and (c) grinding at an approximately central portion of the groove on the laminated substrate in a width narrower than that of the groove so as to cut the laminated substrate.

13. The method for producing a surface acoustic wave element according to claim 12;

wherein in the process (b), the groove is formed by grinding the laminated substrate, and the grinding in the process (b) is performed at a speed lower than that of the grinding in the process (c).

14. The method for producing a surface acoustic wave element according to claim 12, wherein the groove is approximately V-shaped in section.

* * * * *